(12) United States Patent
Finarov

(10) Patent No.: US 6,791,686 B1
(45) Date of Patent: Sep. 14, 2004

(54) APPARATUS FOR INTEGRATED MONITORING OF WAFERS AND FOR PROCESS CONTROL IN THE SEMICONDUCTOR MANUFACTURING AND A METHOD FOR USE THEREOF

(75) Inventor: Moshe Finarov, Rehovot (IL)

(73) Assignee: Nova Measuring Instruments Ltd., Rehovot (IL)

( * ) Notice: Subject to any disclaimer, the term of this patent is extended or adjusted under 35 U.S.C. 154(b) by 386 days.

(21) Appl. No.: 09/626,793

(22) Filed: Jul. 26, 2000

Related U.S. Application Data

(63) Continuation-in-part of application No. 09/509,080, filed as application No. PCT/IL99/00598 on Nov. 7, 1999, now Pat. No. 6,426,502.

(51) Int. Cl.[7] .................. G01B 11/00; G03B 27/42; G03B 27/52
(52) U.S. Cl. ............... 356/399; 355/53; 355/55
(58) Field of Search ............. 355/53, 55; 356/391, 356/400, 401

(56) References Cited

U.S. PATENT DOCUMENTS

| | | | |
|---|---|---|---|
| 4,943,733 A | * 7/1990 | Mori et al. .............. 250/548 |
| 5,455,679 A | * 10/1995 | Houryu et al. ........... 356/401 |
| 5,486,701 A | 1/1996 | Norton et al. |
| 5,604,344 A | 2/1997 | Finarov |
| 5,682,242 A | 10/1997 | Eylon |
| 5,757,671 A | * 5/1998 | Drevillon et al. ........ 356/367 |
| 5,812,705 A | * 9/1998 | Wang et al. ............. 382/294 |
| 5,942,357 A | * 8/1999 | Ota ..................... 430/22 |
| 5,943,122 A | 8/1999 | Holmes |
| 6,057,908 A | * 5/2000 | Ota ..................... 355/55 |
| 6,278,519 B1 | 8/2001 | Rosencwaig et al. |
| 6,426,502 B1 | * 7/2002 | Finarov ................. 250/348 |

FOREIGN PATENT DOCUMENTS

| | | |
|---|---|---|
| EP | 0 412 728 | 2/1991 |
| JP | 63104873 A | 5/1988 |
| JP | 02098955 A | 4/1990 |
| JP | 9-50959 | 2/1997 |
| JP | 11264072 A | 9/1999 |
| WO | 95/11446 | 4/1995 |

OTHER PUBLICATIONS

Dishon et al., "Monitoring Choices of CMP Planarization Processes", pp. 1–10, Feb. 1997.
English Language Abstract of JP 9–50959.

* cited by examiner

*Primary Examiner*—Russell Adams
*Assistant Examiner*—D. Ben Esplin
(74) *Attorney, Agent, or Firm*—Lowe Hauptman Gilman & Berner LLP

(57) ABSTRACT

An integrated apparatus for optically monitoring semiconductor workpieces includes a supporting assembly for supporting the workpiece, and an optical monitoring unit positioned opposite the surface of the workpiece and separated therefrom by an optical window. The optical monitoring unit is mounted for reciprocating movement within a plane parallel to the window for monitoring at least one desired parameter of the semiconductor workpiece and has pattern recognition and auto-focusing utilities. The optical window includes one or more relatively small window fragments located at predetermined locations to enable observation of desired, predetermined portions of the workpiece. The size and shape of the window fragments are selected according to the requirements of transparency in a predetermined spectral range, mechanical strength and ability of pattern recognition and auto-focusing. A method of monitoring semiconductor workpieces through an optical window including one or more relatively small window fragments can be practiced with the integrated apparatus.

22 Claims, 12 Drawing Sheets

US 6,791,686 B1

APPARATUS FOR INTEGRATED MONITORING OF WAFERS AND FOR PROCESS CONTROL IN THE SEMICONDUCTOR MANUFACTURING AND A METHOD FOR USE THEREOF

The present application is a continuation-in-parts of U.S. application Ser. No. 09/509,080 filed May 22, 2000, entitled AN APPARASTUS FOR INTEGRATED MONITORING OF WAFERS AND FOR PROCESS CONTROL IN THE SEMICONDUCTOR MANUFACTURING AND A METHOD FOR USE THEREOF, now U.S. Pat. No. 6,426,502, which is the National Stage of International Application No. PCT/IL99/00598, filed Nov. 7, 1999, which claims the benefit of Israeli Patent Application No. 126949, filed Nov. 8, 1998.

FIELD OF THE INVENTION

The present invention relates to the semiconductor industry in general, and to an apparatus for monitoring wafers and process control in the semiconductor processing and a method for use thereof, in particular.

BACKGROUND OF THE INVENTION

The current trends of shrinking dimensions in the semiconductors industry and the dynamic nature of the processes involved in the semiconductor manufacturing, increase the need for accurate diagnostic tools, capable of providing real time measurements for short time to-respond feedback loops, such as closed loop control and feedforward control. Such stringent requirements cannot be obtained by off-line ("stand alone") measuring systems, which do not provide a real time response. Inspection and measuring by such systems, however precise and accurate they are, slow-down the manufacturing process and consume valuable time and clean room space. On the other hand, in-situ detection devices such as end-point detection devices, which are used at different stages of the production line, although they provide real-time monitoring, their performance is not accurate enough. Such devices are exposed to the conditions in the active area of the production line, thus the data obtained by them is rather an averaging over a relatively large area and they cannot provide mapping capabilities.

This situation enhanced the development of a fundamental solution by means of integrated monitoring and process control, i.e., physical implementation of monitoring tools, with full metrology capabilities, within the production line in the semiconductor fabrication plant. (Dishon, G., Finarov, M., Kipper, R. (1997) Monitoring choices of CMP planarization process, $2^{nd}$ International CMP planarization conference, February 13–14, Santa Clara, Calif.)

The terms "integrated apparatus" or "integrated device" as used in the present invention refers to an apparatus that is physically installed inside the processing equipment or is attached to it and is dedicated to a specific process. Wafers are transferred to said apparatus by the same robot which serves the processing equipment.

Integrated devices should be considered from several aspects and meet specific requirements in order to become real and feasible:

(a) Small footprint—an integrated device should have as small footprint as possible in order to be physically installed inside the Processing Equipment (hereinafter called PE), e.g., inside the Chemical Vapor Deposition (hereinafter called CVD) equipment, inside the Chemical Mechanical Polishing (hereinafter called CMP) polisher or inside the photocluster equipment;

(b) Separation of the measuring unit from the PE environment, e.g., using sealed enclosure. This is aimed at two objectives:
 (I) Cleanliness—measuring unit must not interfere in any way with the operation of the PE or introduce any potential risk for contamination;
 (II) To enable the application of certain conditions inside the integrated apparatus, such as pressurized gases in the CMP equipment (in order to prevent water vapor from penetrating the apparatus);

(c) Maintaining a stationary wafer during measurement in order to minimize system's footprint and to exclude extra wafer handling;

(d) High speed measuring unit (e.g., fast positioning, autofocusing and measurment);

(e) Means to directly respond to a certain cause with the correct straightforward correction action.

(f) Easy and quick maintenance by simple replacement of each functioning unit (component).

(g) Having the option to be bypassed by the production process and to operate at off-line mode.

In addition to the aforementioned specific design requirements, integrated device should have other general functions as described hereinafter.

Reference is made to FIG. 1, prior art, which generally illustrates an integrated apparatus which measures the thickness of thin films on the surface of a silicon wafer (the metrology device known as Integrated Thickness Monitoring system—ITM NovaScan 210, commercially available from Nova measuring instruments Ltd., Rehovot, Israel). The prior art will be described using this metrology device.

In general, the known metrology apparatus of FIG. 1 comprises an optical measurement unit (MU) 1, an external light source 10 and a control unit (CU) 2, which controls the movement and image acquisition of the optical measurement system 1 as well as the operation of the external light source 10. The optical measurement system 'sees' the wafer through an optical window 3. Optical measurement system 1 typically comprises an optical unit 4, whose optical path is shown in detail in FIG. 2, a translation system 5 capable of allocating measurement at any point on the wafer w, such as an X-Y stage, and data and image processing unit 6 forming part of the control unit 2.

The optical path for the exemplary apparatus is illustrated in FIG. 2 and is described hereinafter. The optical unit comprises an external (to the MU 1) white light source 10, an optic fiber 11, a condenser 12, which directs the light onto a beam splitter 13, a focusing target 25, a tube lens 14, a translatable objective 15, an optical window 3 and the wafer's plan w. Behind the beam splitter 13 are located a pinhole mirror 16, a relay lens 17 and a CCD camera 18. Behind the pinhole mirror 16 there is another relay lens 19, a mirror 20 and a spectrophotometer 21. For the apparatus described here, only the objective 15 is translated, parallel to the wafer's plan w.

A light beam 22 emanates from the external light source 10, is conveyed to the MU 1 by fiber optic 11. It enters the MU 1, to the condenser 12 till beam splitter 13 which deflects it toward the wafer w, via lenses 14 and 15 (mirrors which serve as well to convey light beam 22 are not shown) The reflected light beam (not labeled) is transmitted by lenses 14 and 15, passes through beam splitter 13 and is deflected by pinhole mirror 16 to the CCD camera 18 where the image acquisition takes place. The portion of the light beam, which passes through the pinhole in the pinhole mirror 16, reaches the spectrophotometer 21. The focusing target 25 is any high contrast object, such as a metallic pattern on a glass substrate. The pattern can be any easily identifiable pattern, such as a contrast edge, a grid, etc.

The main two functions of the optical unit 4 are the positioning (including focusing, image acquisition and image processing) channel 100 and the measuring (including illumination and detection) channel 200. The positioning channel 100 is aimed at identifying the exact location of the wafer w and the specific sites on the wafer w where measurements have to be done. Autofocusing using, among other things, focusing target 25, is performed according to any method known in the art. Such a method based on the patterned features on the wafers is disclosed in U.S. Pat. No. 5,604,344. After the positioning and autofocusing are done, the objective 15 is located above the predetermined location on the wafer w. Now, a measurement is conducted by the measuring channel 200. It should be noted that the positioning channel 100 and the measuring channel 200 are partly composed of the same optical elements as shown in FIG. 2, especially with respect to the moving optical head which is the objective 15 in this case. This overlap is feasible, mainly because both channels 100 and 200 in the ITM NovaScan 210 use almost the same spectral range. A direct result of this situation is that single optical window 3 is capable to serve both channels.

However, another situation is when an integrated measurement device uses different wavelengths for the positioning channel and for the measuring channel, or when optical measurements are required at more than one spectral range. For example, a method for layer composition measurements and contamination analysis during the CVD process is conducted by infrared optical assembly which cannot be used for the positioning channel 100. Therefore, with respect to applications when different wavelengths are used for positioning and for measurements or when measurements at different spectral ranges are required, a new shortcoming of the common integrated devices arises: due to optics limitations, both positioning channel 100 and measuring channel 200 cannot use the same optical elements and the optical window 3 cannot serve both channels, as known to a man skilled in the art. With respect to the known ITM NovaScan 210 presented above, optical window 3 designed for positioning channel 100 and operation under visible light conditions, cannot serve UV, Infrared or X-rays measuring. Moreover, recalling the specific requirements for integrated device, this problem cannot be solved by installing two different optical windows with similar dimensions to those of optical window 3 due to footprint limitations. Alternatively, a permanent omission of the optical window 3 is not practical because of the requirement to separate the MU 1 from its environment.

Therefore, the objectives of the present invention is to overcome the aforementioned limitations:

1) To provide an integrated apparatus for monitoring and process control under conditions where different spectral ranges are used for positioning, measurement, mapping and any other operation performed by the apparatus or any combination of such operations.
2) To provide specifically an integrated apparatus for monitoring layers thickness and layers composition and for process control using visible light and FTIR, respectively.
3) To provide specifically an integrated apparatus for monitoring the thickness and the photosensitivity of photoresist layers by using respectively, visible and ultraviolet spectrophotometry
4) To provide specifically an integrated apparatus for monitoring layers thickness and layers composition and for process control by using x-ray spectroscopy.

Hereinafter the term "optical unit" as used in the present invention means an assembly that includes all of the physical optical components that enables the performing of optical activities (e.g., measurements, image acquisition) at a specific spectral range, where the optical components comprise an illumination source, preferably external, a detector (e.g., spectrophotometer) or imaging device (e.g., area CCD) and a suitable combination of optical elements, such as lenses, beam splitters, mirrors, fiber optics and so on, for directing the input illumination beam toward the wafer and the output beam, from the wafer into the detector;

The illumination source can be external to the measuring unit in which all the other components of the optical unit are assembled or can be installed within the measuring unit. In the first case the light beam is conveyed to the measuring unit by a suitable light guide.

The term "channel" or "optical channel" as used in the present invention means the using of an "optical unit" for specific purpose and includes the communication with a control unit as well as electricity supply.

Thus, an "optical unit" can serve more than one "channel", as in the example above. In this example of the ITM NovaScan 210, channels 100 and 200 operating at visible light, comprise nearly the same optical components (except a spectrophotometer and a CCD) denoted for convenience as optical unit 4 (wherein the light source 10 is part of unit 4).

SUMMARY OF THE INVENTION

It is the object of the present invention to overcome the limitations of the prior art.

The present invention relates to an integrated apparatus for monitoring wafers and for process control in the semiconductor manufacturing process, by means of optical measurements at more than one spectral range, and a method for use thereof. Said apparatus comprising at least two separate optical units, each for measurements at a different spectral range wherein each unit uses a different optical window.

The present invention further relates to a method for monitoring of wafers and for process control in the semiconductor manufacturing by optical measurements at more than one spectral range for any process in the semiconductor manufacturing and for the CVD process, in particular.

The apparatus according to the present invention comprises a measuring unit for performing optical measurements in predetermined sites on said wafer, illumination sources for illuminating said wafer via measuring unit, supporting means for holding, rotating and translating the wafer and a control unit connected to said measuring unit, to said supporting means and to said illumination sources. The measuring unit comprises: (a) at least two separate optical units, each operating at a different distinct spectral range; (b) a separate optical window for each optical unit through which the wafer is illuminated; (c) at least one movable optical head which includes part or all of the optical components of said optical units; (d) mechanical means for translating said optical head relatively to the wafer's surface such that each of said optical units can measure the whole area of the wafer through its corresponding optical window and perform autofocusing.

The apparatus, according to the present invention, can be installed inside any part of the semiconductor production line, i.e., inside the photocluster equipment, the chemical vapor deposition (CVD) equipment or the chemical mechanical polishing (CMP) equipment.

In a preferred embodiment of the present invention, one optical unit, comprising of optical elements suitable for measurements in the visible range, is used for positioning and for obtaining spectroscopic data in the visible range. The other optical unit or units consist of optical elements suitable for measurements at any other spectral ranges, such as the infrared, ultraviolet or X-ray or at a specific wavelength.

In a preferred embodiment of the present invention, said apparatus is installed inside the CVD equipment cluster and comprises two optical units. One optical unit, comprising of optical elements suitable for measurements in the visible range of the electromagnetic spectrum, is used for positioning and for thickness measurements. The second optical unit is for layer composition measurements and contamination analysis and comprises of optical components suitable for measurements in the infrared range of the spectrum based on Fourier Transform Infrared spectrometry (FTIR).

In another preferred embodiment of the present invention, the second unit comprises optical elements suitable for illumination and optical measurements in the ultraviolet range of the spectrum, is used for illuminating a wafer by ultraviolet illumination and measuring the reflected signals by means of a detector.

Yet in another preferred embodiment of the present invention, the second unit comprises optical elements suitable for illumination and optical measurements in the X ray range of the spectrum, is used for illuminating a wafer by X ray radiation and measuring the reflected signals by means of a detector.

In a preferred embodiment of the present invention the measuring unit comprises two adjacent elongated windows of length equal to or longer than a semiconductor wafer radius and separated by a distance d. The wafer is held by a stable support with means for rotating the wafer around an axis perpendicular to its plane. The movable optical head has means to move along the window length, and either the supporting means of the wafer or the movable optical head have means for linear translation along the x axis perpendicular to the windows elongated axis and equal to the distance Δx between the windows' centers such that the wafer can be centered under one window or the other. This design of the windows, combined with the relative movements of wafer and optical head, enables each optical unit to measure any point on the surface of a wafer.

Yet, in another preferred embodiment of the present invention, the wafer's supporting means has means for accurate rotation.

According to the present invention, there can be more than two optical units and corresponding windows, wherein the supporting means or the optical head have several positions or continuous translation with appropriate motion control along the x axis.

According to another embodiment of the present invention, the integrated apparatus of the present invention comprises; a supporting assembly for supporting said workpiece; an optical monitoring unit accommodated opposite the surface of said workpiece and separated therefrom by an optical window, said optical monitoring unit is mounted for reciprocating movement within a plane parallel to said window for monitoring at least one desired parameter of said semiconductor workpiece and having a pattern recognition and an auto-focusing utilities. Said optical window comprises one or a plurality of relatively small window fragments located in pre-determined locations to enable observation of desired pre-determined portions of said workpiece and the size and shape of said window fragments are selected according to the requirements of transparency in a pre-determined spectral range, mechanical strength and ability of pattern recognition and auto-focusing.

According to one embodiment of the present invention said supporting assembly is mounted for substantially slow rotation;

The optical monitoring unit can comprise a spectrophotometer or an ellipsometer.

The desired portions of the workpiece preferably include the center and part of the edge of said workpiece. In one embodiment at least one of said optical window fragments is of a circle's sector shape. Yet in another embodiment at least one of said window fragments is of a rectangular shape and optionally one additional optical window fragment is of a bent strip-like shape around the workpiece' edge.

The present invention further relates to a method for optical monitoring of semiconductor workpiece having an axis of symmetry, for process control in the semiconductor production process, by optical scanning the workpiece, using movable optical unit, through optical window designed as a plurality of relatively small window fragments which are located in pre-determined locations to enable observation of desired portions of the workpiec and defining at least one desired parameter of said semiconductor workpiece at said desired portions. The size and the shape of said fragments being selected according to the requirements of transparency in the pre-determined spectral range, mechanical strength and ability of pattern recognition and auto-focusing.

The track of said optical scanning is designed in such a manner that enables pattern recognition and autofocusing.

Said method can further comprise rotation of said workpiece by a pre-determined angle.

According to a preferred embodiment of the present invention, said workpiece has multi-layer structure and at least one of the desired parameter to be measured is the thickness of at least one of the workpiece' layers and said optical scanning includes measuring of spectral characteristics of light response of the scanned portions of the workpiece.

BRIEF DESCRIPTION OF THE DRAWINGS

The present invention will be further understood and clarified by the following drawing description. This description does not intend, in any way, to limit the scope of the present invention.

FIG. 3(*b*) illustrates the optical unit of the measuring channel of an integrated apparatus according to a preferred embodiment of the present invention.

DETAILED DESCRIPTION OF THE INVENTION

It is common knowledge to people who are skilled in the art of the present invention, that application of different ranges of wavelengths for different purposes in a single apparatus is not feasible using the same optical elements for both ranges due to limitations of refractive and reflective optics. Thus generally, different optical components should be used for each distinct wavelengths range.

Therefore, in addition to the principles of integrated devices mentioned in the background, the design of the integrated monitoring apparatus should meet additional principles according to the purposes of the present invention:

(a) Separation between optical units that operate at different spectral ranges.

(b) A different optical window for each unit, made of materials transparent to illumination used at that unit. As an option, a window may be opened for a predetermined period of time to allow measurements under special conditions (such as X-ray measurements)

(c) Different illumination sources for each optical unit which can be either installed within the optical unit or can be external to said unit. In the latter case, separated means to convey the light (e.g. optic fiber) from each external source to its channel inside the sealed enclosure, are required as well.

Due to footprint limitation each window is smaller than a wafer (as compared to optical window 3) and therefore an additional principle is:

(d) Mechanical means to control the relative movement of the movable optical components with respect to the wafer in a way which enables each of the optical units to reach any point of the wafer w.

DETAILED DESCRIPTION OF PREFERRED EMBODIMENTS

Figure 1:
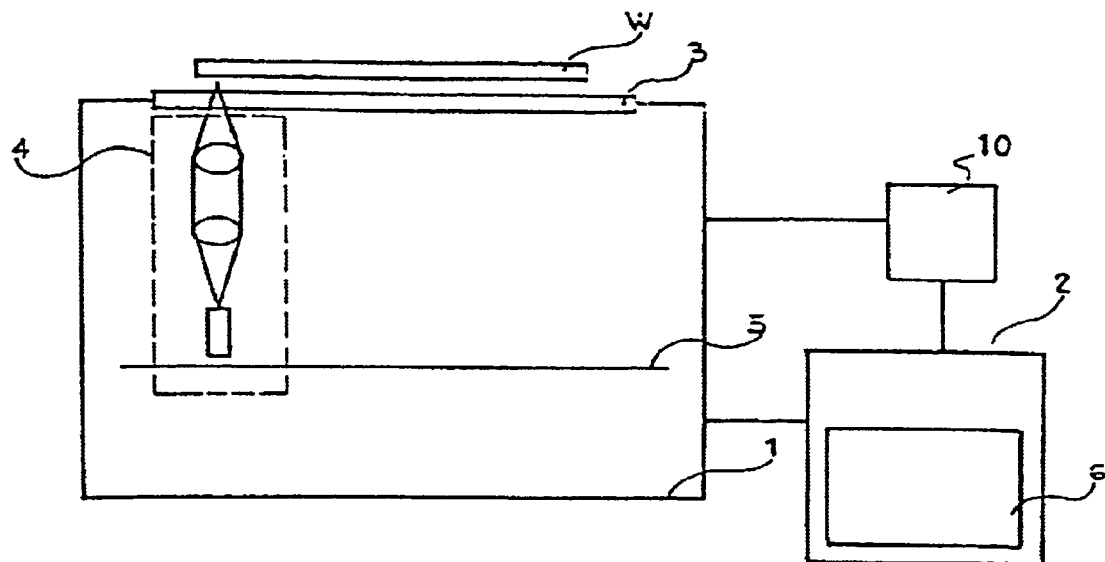
FIG. 1 is a schematic illustration of an exemplary known integrated metrology apparatus.
Figure 2:
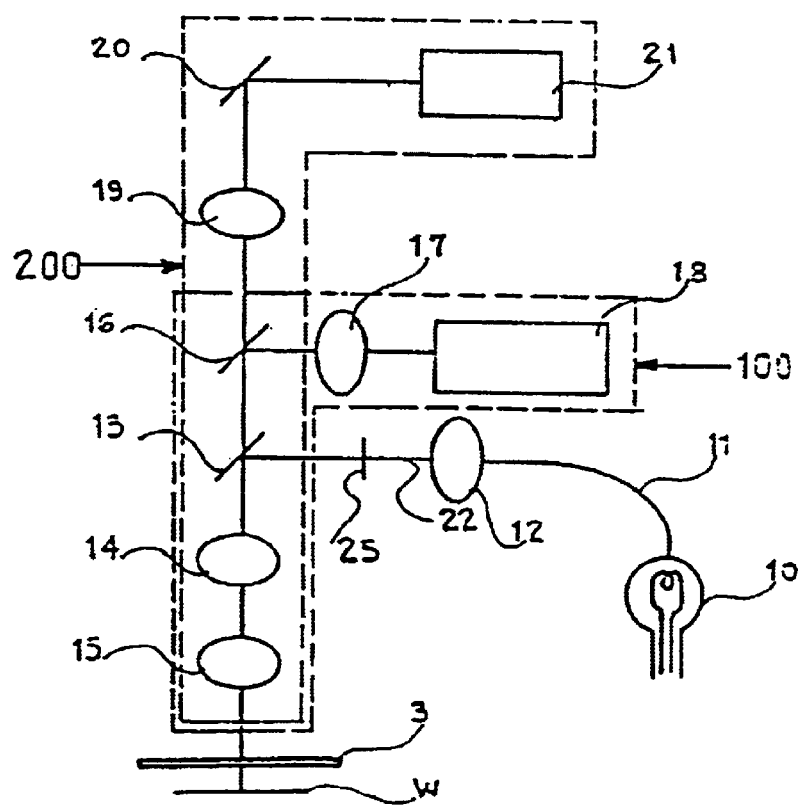
FIG. 2 is a schematic illustration of a known integrated apparatus optical unit
Figure 3A:
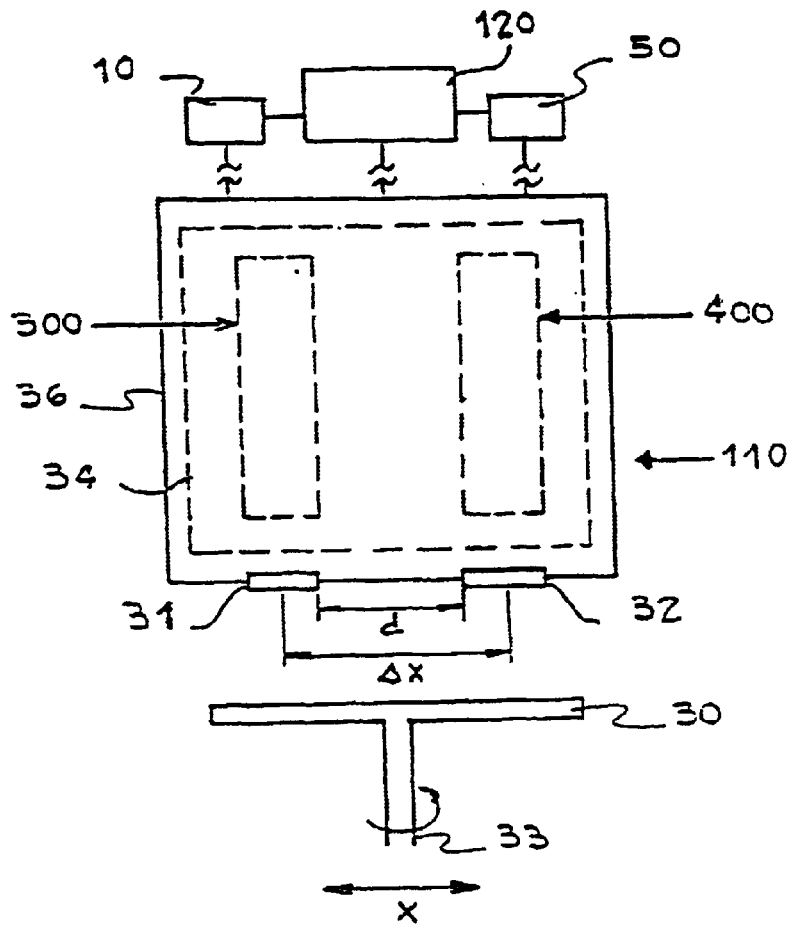
FIG. 3(*a*) is a schematic side view of an integrated apparatus according to a preferred embodiment of the present invention.

Reference now is made to FIG. 3(a), which schematically illustrates a side view of an integrated apparatus for monitoring and process control according to a preferred embodiment of the present invention. It comprises two external light sources 10 and 50, a measuring unit (MU) 110 and a control unit 120. The external light sources can be any illumination sources for different spectral ranges (e.g., deep UV, visible light, infrared). The light is conveyed to the MU 110 by light guides (e.g., fiber optics) (not shown). The MU 110 comprises a sealed enclosure 36 and in it there are three different channels: (i) a positioning channel, (ii) a measuring channel for visible light optical measurements, such as thickness measurements and (iii) a measuring channel 400 based on spectral range other than the visible range. Since both channels (i) and (ii) use the same spectral range, i.e., visible range, and have nearly the same optical components, they are physically combined into one optical unit in a similar way to the optical configuration presented in FIG. 2, and will be referred to as optical channel(s) 300 in FIG. 3(a). Channel 400 is realized in a separate optical unit. The apparatus comprises rigid and stable supporting means 30, which holds the wafer w during measurement. This can also be a vacuum chuck (not shown) which clamps the wafer w from its bottom side. In addition, the supporting means 30 has optionally the ability to rotate around an axis 33 and to move along the x axis (along the figure plane). The integrated apparatus has similar basic components (e.g., MU 1 and CU 2) as the aforementioned integrated tool (FIG. 1).

As shown in FIG. 3(a) positioning and measuring channel 300 is separated from measuring channel 400 and each of which comprises optical elements suitable for the applied spectral ranges. In addition, each of the channels 300 and 400 uses different optical windows 31 and 32. Positioning and measuring channel 300 is similar to the optical path of the ITM NovaScan 210 and is illustrated in FIG. 2. Reference is also made to the description of optical unit 4 and its optical path of FIG. 2 Which describes the optical components, optical function and operation of channel 300.

Figure 3B:
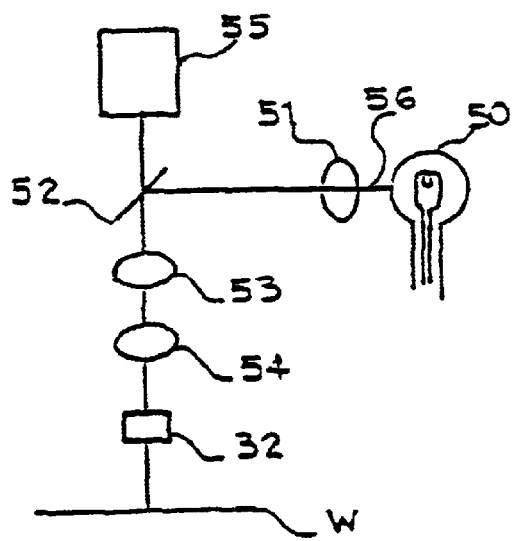

FIG. 3(b) illustrates the second measuring channel 400 operating at a different spectral range. In this embodiment, it comprises an external illumination source 50, means to convey the light 56 to the measuring unit (e.g., a suitable fiber optic, suitable mirrors), a condenser 51, which directs the radiation onto a beam splitter 52, a tube lens 53, a translatable objective 54, optical window 32 and the wafer's plan w. Behind the beam splitter 52 located a suitable detector (e.g., spectrophotometer) 55. The beam splitter 52 receives a light beam emanating from the light source 50 via the convey means 56 and deflects it toward the wafer w, via lenses 53 and 54 and optical window 32. The reflected light beam (not labeled) is transmitted by lenses 54 and 53, passes through beam splitter 52 to the detector 55. It is obvious to a man skilled in the art that other components like concave mirrors etc. may be used as well.

Both channels 300 and 400 are controlled by the control unit 120, as well as the light sources 10 and 50.

The movable parts of channels 300 and 400 (e.g., part of channels 300 and 400 or all their components) are mounted together in a single moveable optical head 34 as shown in FIG. 3(a). The optical head 34 can move along the y axis (normal to the drawing plan) and the z axis (vertical, for focusing in the wafer plan w), and optionally along the x axis.

Regarding the optical windows 31 and 32 (FIG. 3(a)), the integrated tool according to a preferred embodiment of the present invention has two strip-like optical windows, one for the positioning and measuring channel 300 and a second optical window 32 for the measuring channel 400. Each of which is made of material capable of transmitting the specific electromagnetic waves used in its channel. The width of the optical windows 31 and 32 is determined according to the field of view and numerical aperture of each of the 300 and 400 channels. In order to enable the optical head 34 to reach any point on the wafer w, the lengths of the optical windows 31 and 32 are equal or longer than the wafer's radius, preferably smaller than a wafer's diameter but a little bit bigger than a wafer's radius. In order to meet the demand for as small as possible footprint of the integrated tool, the physical separation d between the optical windows 31 and 32 is set to the possible minimum, such that the two windows are adjacent to each other. Therefore, the linear translation Δx of the supporting means 30, or alternatively the optical head 34, along the x axis, should be no more than the distance between the optical windows 31 and 32 centers.

Figure 4:
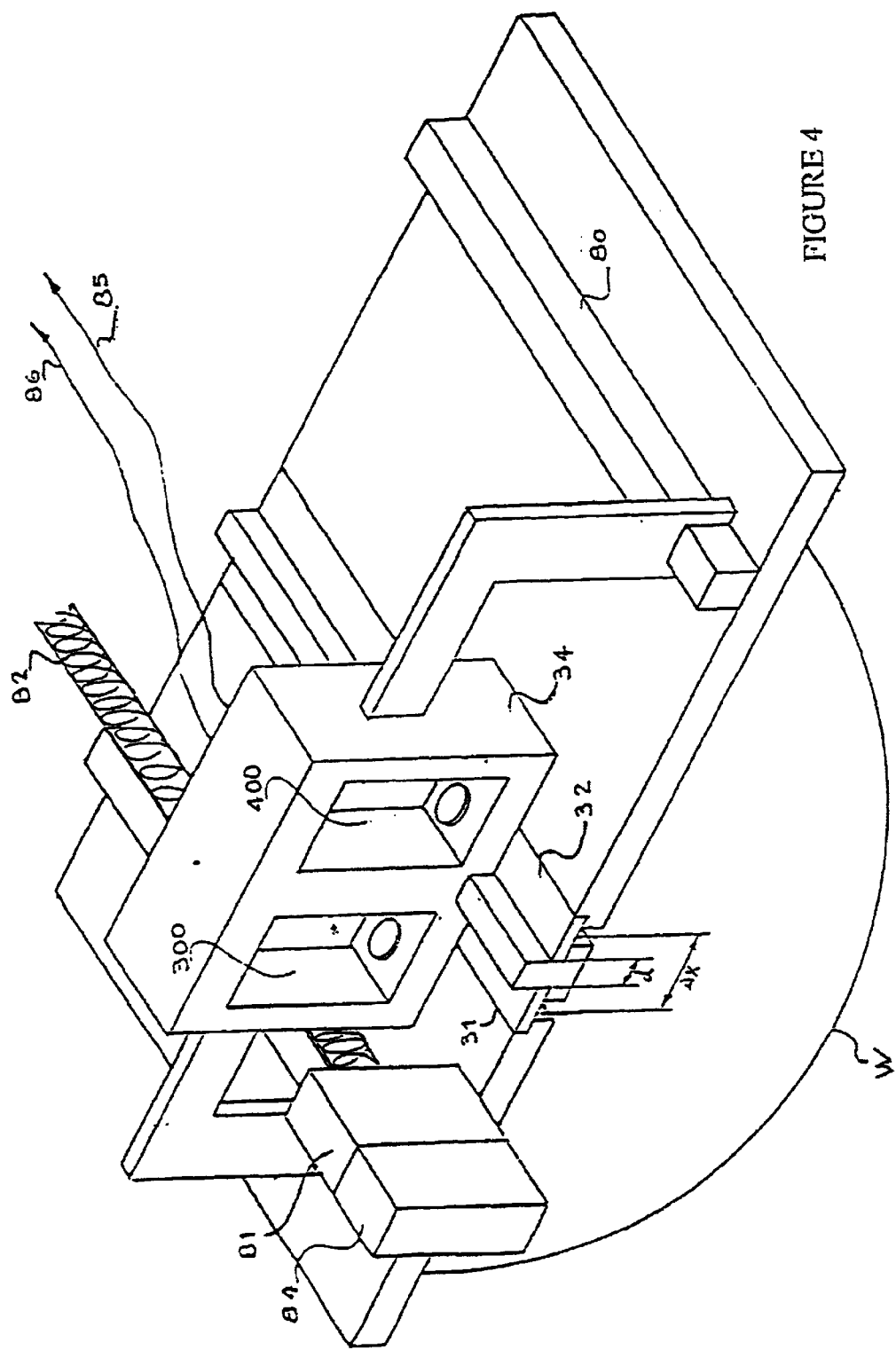
FIG. 4 is a three-dimensional side view of the integrated apparatus.

FIG. 4 illustrates a three-dimensional view of an integrated tool according to a preferred embodiment of the present invention. In this embodiment, both channels 300 and 400 are mounted inside a movable optical head 34. The optical head 34 moves on linear rails 80 along the y axis and above the optical windows 31 and 32 and the wafer w. The motion is performed by a motor 81 which drives a screw 82 connected to the optical head 34 (connection not shown). The motor is controlled by the CU (not shown) and monitored by an encoder 84. The optical head 34 is connected to the CU by electric wires 85 and to the external illuminations sources by optical means (e.g., optic fiber) 86 through which light, electric supply, and data are transferred.

According to a preferred embodiment of the present invention, the integrated apparatus is for monitoring and process control of dielectric layers thickness and composition, e.g., CVD equipment (hereinafter—ITM CVD). Its optical scheme is similar to that presented in FIG. 3(a), where channel 300 serves for positioning and for measuring layers thickness using visible light and channel 400 serves for layer composition measurements and for contamination analysis and is based on infrared optical components.

Figure 5A:
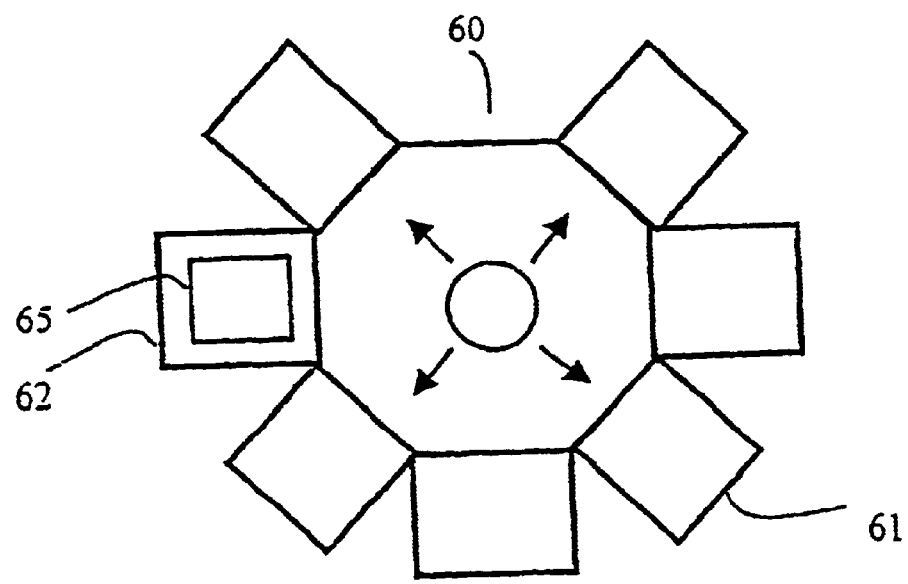
FIGS. 5(*a*) and 5(*b*) are possible implementations of ITM CVD apparatus within CVD equipment
Figure 5B:
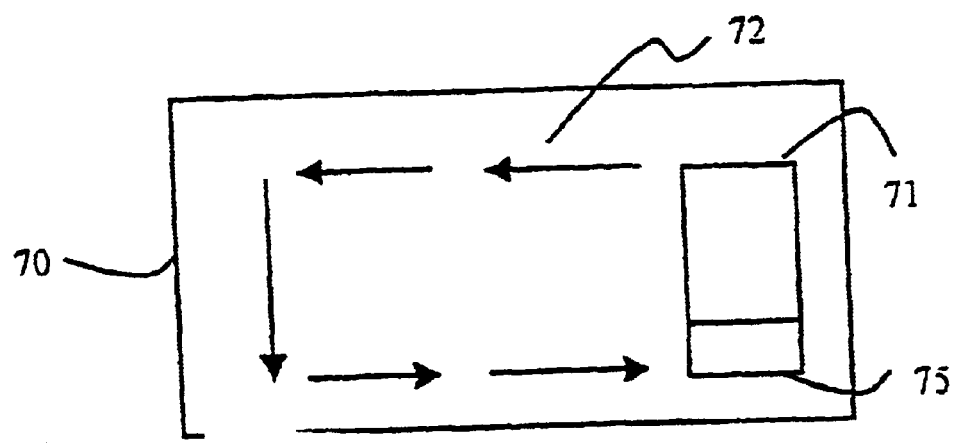

Reference is now made to FIGS. 5(a) and 5(b) which illustrate possible installations of ITM CVD with CVD tools.

FIG. 5(a) illustrates an ITM CVD 65 integrated inside a cluster CVD tools 60 which is composed of several chambers such as the CVD) 61 and cooling down 62 chambers. The ITM CVD 65 can be installed into one of the cooling down chambers 62, or into any other chamber suitable for this purpose.

FIG. 5(b) illustrates a non-cluster CVD equipment 70. It includes a cassettes load/unload station 71, a conveyor 72 which moves the wafer from one station to the next station of the CVD sub-processes. The ITM CVD 75 can be installed in the vicinity of the cassettes load/unload station 71.

According to another preferred embodiment of the present invention, channel 400 the of the integrated apparatus is based on UV optical components. Its optical scheme is similar to that presented in FIG. 3(a), where channel 300 serves for positioning using visible light and channel 400 serves for UV measurements.

Figure 6:
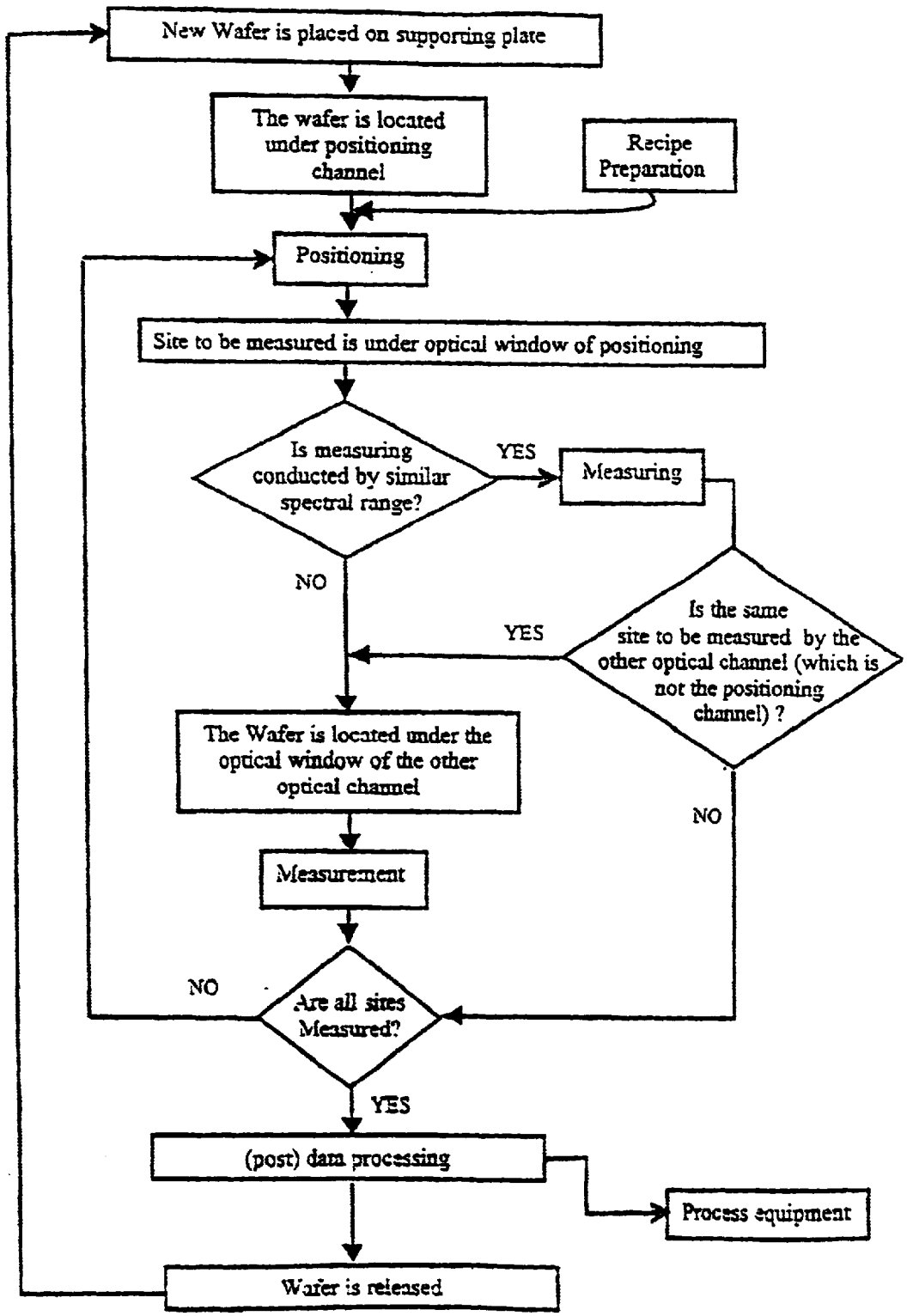
FIG. 6 is a flow chart of a method for integrated monitoring and control of CVD process.
Figure 7A:
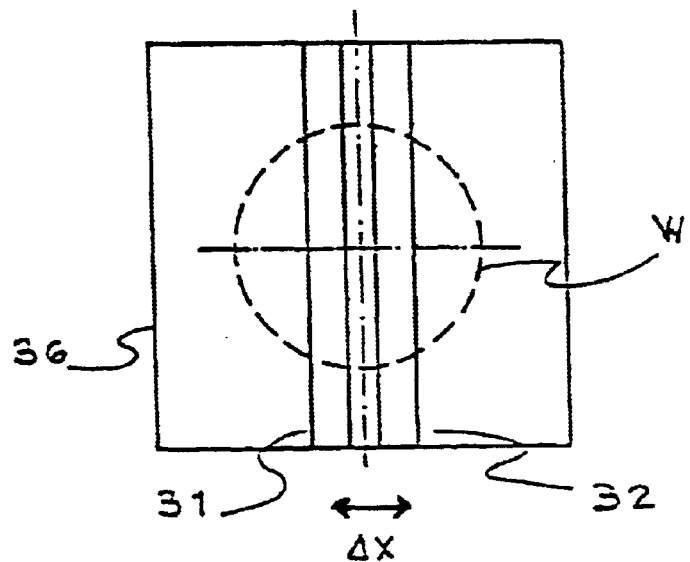
FIGS. 7(*a*) and 7(*b*) illustrate a side view and a top view of a possible initial configuration of the integrated apparatus.
Figure 7B:
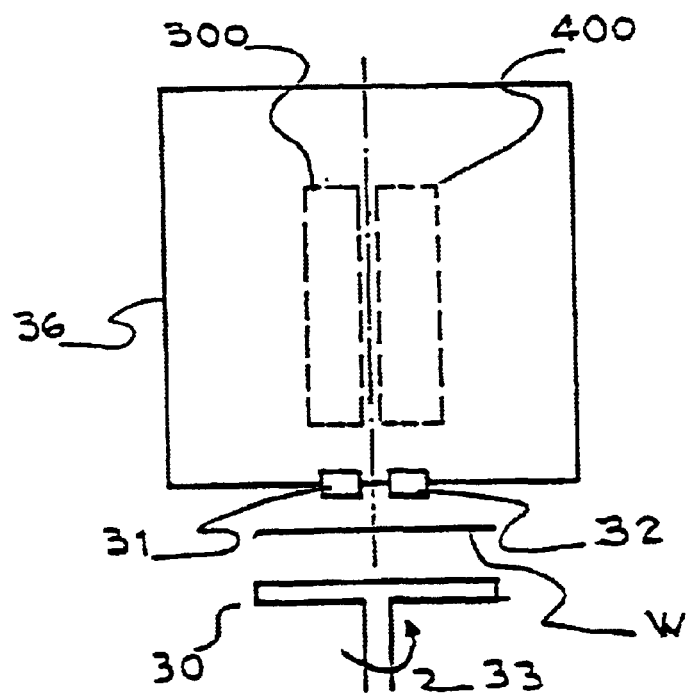
Figure 8A:
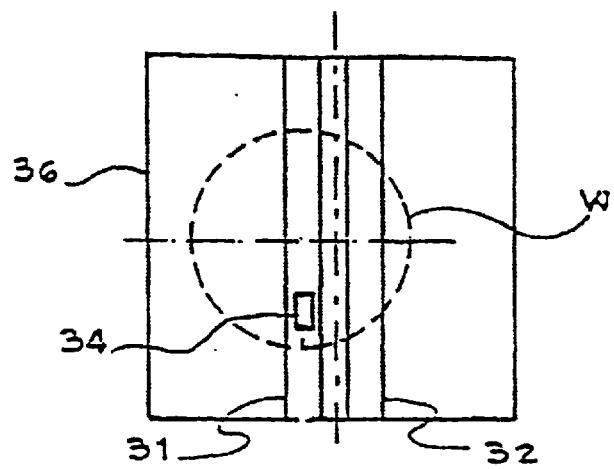
FIGS. 8(*a*) and 8(*b*) are schematic illustrations of respectively, side view and top view of the integrated apparatus when the positioning channel is operated.
Figure 8B:
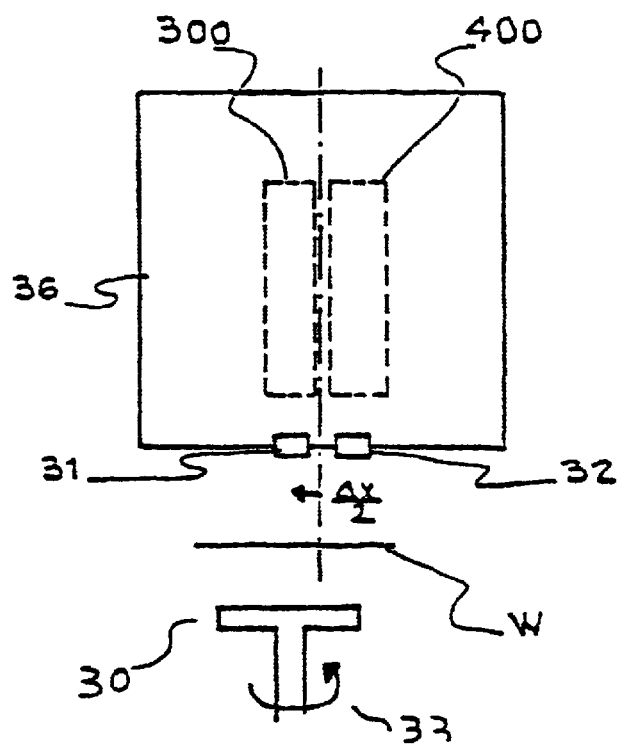

A reference is made to FIG. 6 which illustrates a method according to the present invention for operating an integrated apparatus which uses at least two different spectral ranges. This method is elucidated with the aid of FIGS. 7–9. As shown in Pigs. 7(a) (top view) and 7(b) (side view), the supporting means 30 is located under the sealed enclosure 36. At the next step, the supporting means 30 accurately moves the wafer w by a pre-determined distance Δx/2 and locates the wafer under the optical window 31 of the positioning channel 300 as shown schematically in FIGS. 8(a) and 8(b).

If the wafer w is not aligned, pre-alignment can be performed according to any known method such as that which is disclosed in US application Ser. No. 09/097,298. Final positioning can be conducted according to any known method such as the method disclosed in U.S. Pat. No. 5,682,242 based on patterned features. Alternatively, the whole positioning step can be conducted (without rotating the wafer) according to the method disclosed in U.S. Pat. No. 5,682,242. During the positioning step, the optical head 34 may move along the optical window 31 followed by (or simultaneously) rotation of the wafer w by rotation means 33 in order to locate under the optical window 31 any point of the wafer w.

Figure 9A:
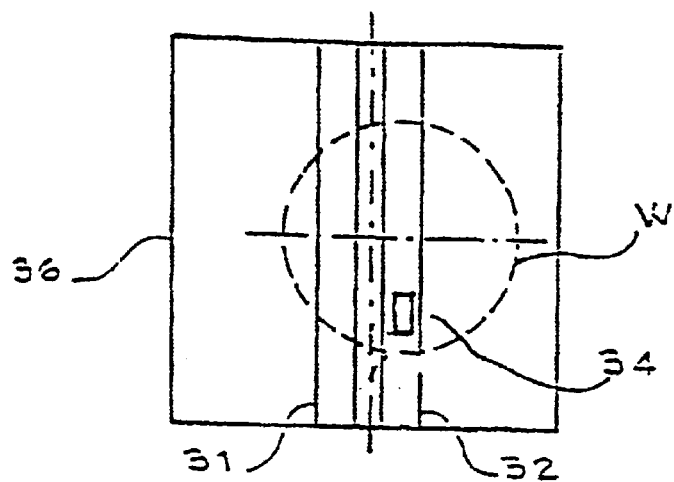
FIGS. 9(a) and 9(b) are schematic illustrations of respectively, a side view and a top view of the integrated apparatus when the measurement channel is operated.
Figure 9B:
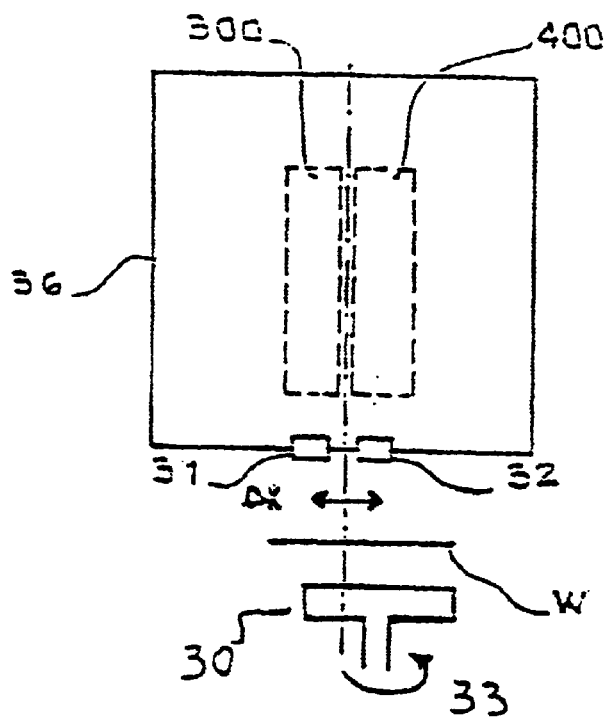

When positioning is completed and the predetermined site (defined during recipe preparation) is found, measuring commences. If the spectral range used for measuring is similar to that used for positioning, measuring is conducted with the same channel 300. However, if spectral range in addition to or other than that used for positioning is needed for measuring or detection, the supporting means 30 accurately moves the wafer w by a distance Δx and locates it under the optical window 32 of the measuring channel, and measuring is conducted as shown in FIGS. 9(a) and 9(b).

According to another preferred embodiment of the present invention, an accurate x-y stage for the optical head 34 is designed (accurate to a level to be determined). Then an accurate translation along x axis between windows 31 and 32 is performed, as well as along the y axis, in order to locate the measuring channel 400 above the pre-determined site to be measured.

It should be noted that if y translation of the optical head and rotation means 33 are designed to be accurate enough, once positioning is completed, there is no need for the linear translation of the optical head 34 along the x axis. Instead, the processed positioning data is used by the CU 120 to accurately positioning (by accurate movement according to polar (r, φ) coordinates system) the pre-determined site under optical window 32 and under the optical head 34 in a measuring position.

This mode of operation is beneficial in eliminating additional x axis and corresponding Δx movement. However, in this case, a small central area of about Δx/2 radius can not be reached by both channels.

Actually both modes of operation may be used. When a measurement site is located near the wafer center, the additional Δx movement is needed. However, when other sites located far from the wafer's center are to be measured, only combined rotation of the supporting means and y translation of the optical head are used.

The aforementioned process is repeated when several sites on the wafer w are to be measured. It should be noted that there are cases, in which the whole wafer w is measured (e.g., inspection), i.e., the supporting means 30 directly moves the wafer w under optical window 32 of the measuring channel 400, skipping over the alignment channel 300.

The measured data is transferred to the control unit 120 which can instruct the measuring unit 110 itself with respect to its operation (e.g., sampling frequency, sites number to be measured on a wafer). Simultaneously or alternatively, these data can be used for a feedback (or feed forward, depend on the configuration) closed loop control to the processing equipment such as the CVD tools.

According to the present invention, the integrated tool can have more than two optical windows (not shown) for each measuring channel which applies different spectral ranges which require different material to enable the electromagnetic radiation to pass, e.g., an integrated tool using visible, deep UV, Infrared and x-rays illumination and/or detection. In this case, either the supporting means 30 or the movable head 34, should have accurate translation means with appropriate motion control to enable locating a pre-determined site on the wafer to be measured under the appropriate measuring channel.

Figure 10:
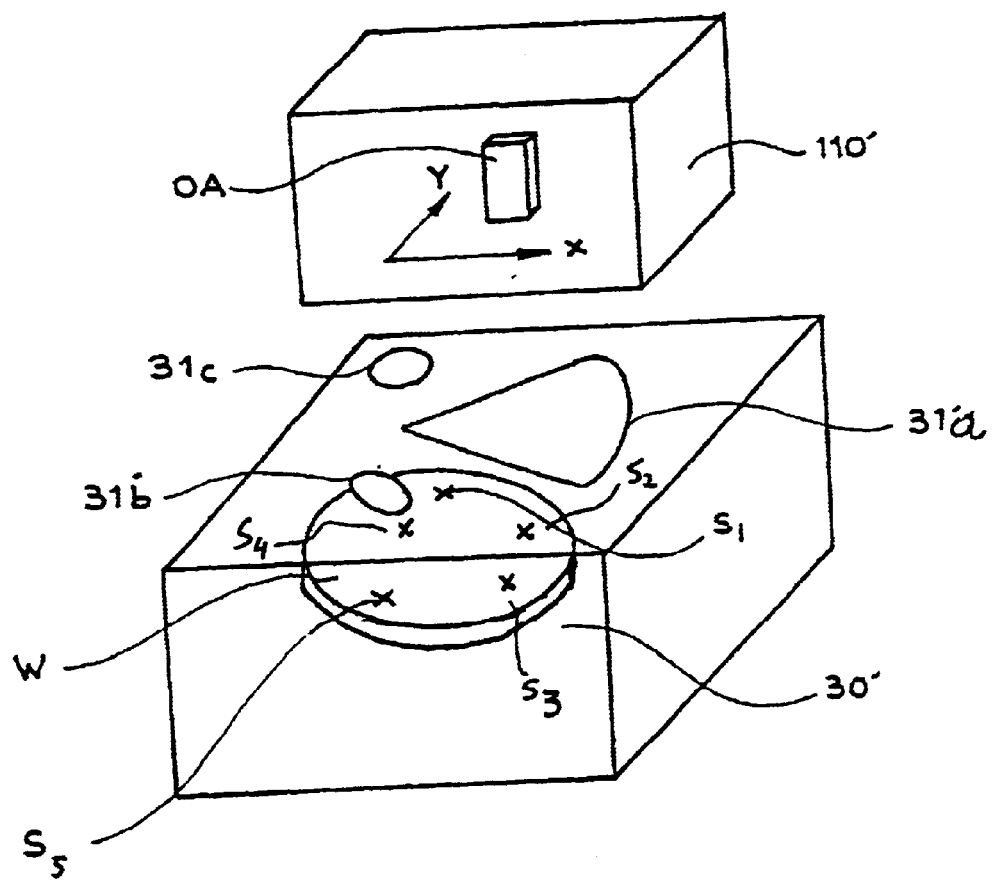
FIGS. 10A and 10B are schematic illustrations of an integrated measuring apparatus according to another preferred embodiments of the present invention.
Figure 10:
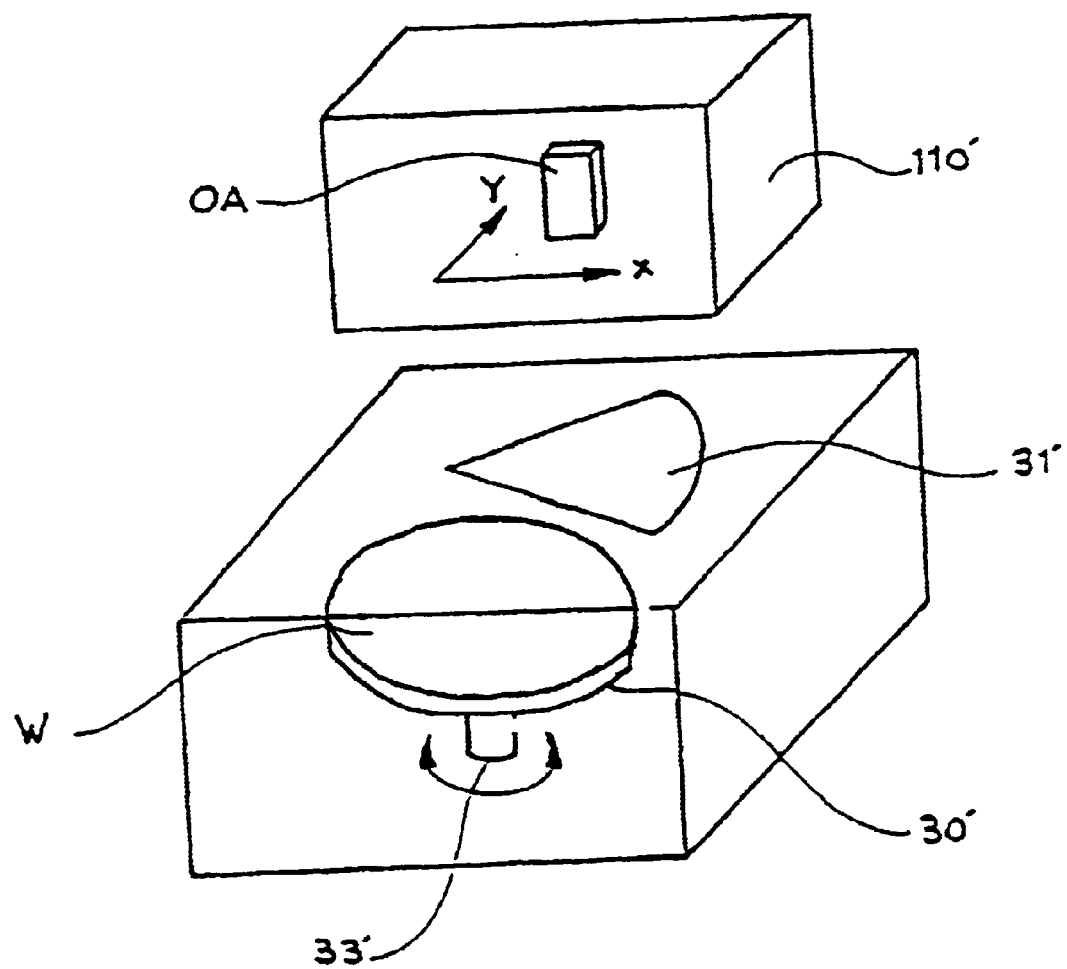

Reference is now made to FIG. 10A, which illustrates a further embodiment of the present invention. FIG. 10A illustrates an integrated apparatus for monitoring workpiece and for process control in the semiconductor industry, comprising a measuring unit (MU) 110', having an optical assembly OA. The optical assembly OA comprises a measuring channel, an Auto-Focusing and imaging (positioning) optical channel and a positioning X-Y translation unit (as shown in FIG. 1). The measuring channel performs optical measurements such as thickness measurements and/or measurements of optical parameters of semiconductor workpiece having an axis of symmetry e.g. wafer W, and the imaging channel could perform positioning and auto-focusing functions. The imaging and measuring channels may be similar to those of the ITM NovaScan 210, for performing measurements at different selected points (hereinafter called measurements sites) on the wafer's surface and for scanning. In order to enable scanning, the optical assembly OA comprises movable parts and is provided with an X-Y translation unit (as shown of FIG. 1). The apparatus further comprises appropriate illumination sources, a control unit and a user interface (not shown).

According to this embodiment, for performing thickness measurements, the processed wafer W is transported by internal cluster tool robot (not shown) from the cluster working area to the supporting assembly 30' within the measuring area. The supporting assembly 30' is located under a fragmented window composed, in this specific example, from three fragments 31'$a$, 31'$b$ and 31'$c$. The fragment 31'$a$ enables measuring at the measuring sites designated as $S_1$–$S_3$ and the two relatively small fragments 31'$b$ and 31'$c$ enable measuring at measurements sites designated $S_4$ and $S_5$ without additional moving of the wafer W. It is readily appreciated, that location of additional fragments of window can be chosen in accordance with desired pre-determined measurement sites.

Reference is now made to FIG. 10B, which illustrates still another embodiment of the present invention. According to this embodiment, the supporting assembly 30' is located under window 31' and is provided with a rotation drive 33'. The rotation drive 33' performs relatively slow rotation of the supporting assembly 30' along with the supported wafer W. Such a rotational movement is slow and therefore does not require additional clamping or other fixation means. It could be provided by relatively simple and cheap wafer handling and rotation assembly, and not by the expensive electrostatic chuck, usually used for wafer clamping.

The preliminary alignment of the wafer W can be performed by rotating the wafer and finding its notch or flat. During the rotation step, the optical head may be positioned above the edge portion of the wafer for notch/flat determining. Final alignment can be performed on the base of patterned features according to the U.S. Pat. Nos. 5,682,242 and 5,867,590 in the name of Nova Measuring Instruments Ltd. Once the desired orientation of the wafer W is obtained, the measurement step can be performed. The movable parts of the optical assembly OA (i.e., the movable optical head) are moved to the desired measurement sites, which could be recognized using pattern recognition, performing autofocusing procedure during the movement, i.e., dynamic autofocusing. After completing the measurement procedure at the measurements sites available (i.e., those under window), the wafer is rotated in accordance with the window fragments configuration for measuring further pre-selected measurement sites.

Figure 11:
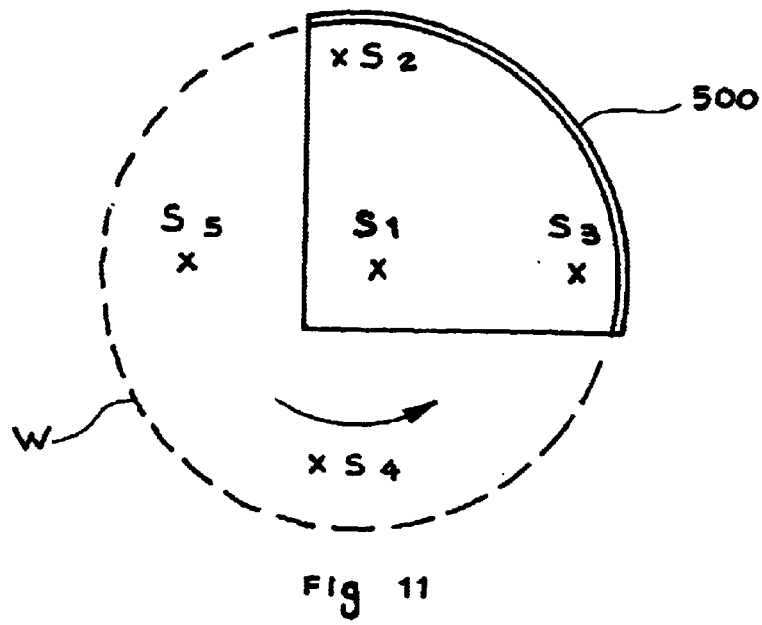
FIGS. 11 to 14 are schematic illustrations of different fragmented window configurations forming part of the apparatus of FIGS. 10A and 10B.

Reference is now made to FIG. 11, which illustrates a possible configuration of a window forming part of the apparatus of FIG. 10B. The window must be strong enough to maintain the pressure difference between vacuum within the working area of the deposition equipment (CVD) to the atmospheric pressure in the MU. The window also must be transparent to light in the spectral range of the optical measurements, for example in deep ultra-violet range (DUV). In some cases, for example for a 300 mm diameter wafer, it is hardly possible to manufacture a window which will be big enough to cover the whole wafer area, and still will meet those optical and mechanical requirements.

According to the embodiment of FIG. 11, the window designated 500 is built in the form of a sector of a circle, covering about ⅓ of the wafer W surface (enlarged quadrant), in order to meet above requirements for an ITM apparatus installed in deposition (CVD) equipment of FIGS. 5($a$) and 5($b$). Typical locations of the measuring sites are designated $S_1$–$S_5$. In order to provide measurements in sites designated as $S_4$ and $S_5$, the wafer W should be rotated by 180°. Therefore, only one rotation by rotation drive 33' should be provided to cover the entire surface of wafer W. It is readily appreciated that the apparatus of FIG. 10 having such configuration of window, may be useful for both typical sizes of wafer, manufactured now, i.e. 200 and 300 mm. Thus, a relatively small window surface which covers the entire 200 mm wafer, is useful for a 300 mm wafer when the wafer is handled on rotatable supporting assembly in such a manner that the central and edge portions of the wafer are observable through the window. Indeed, the ratio of 200 mm and 300 mm wafers' surface is $(200/300)^2 = 0.444$, therefore a window which covers an entire 200 mm wafer may be used for about 0.44 part of 300 mm wafer's surface without increasing its thickness.

Figure 12:
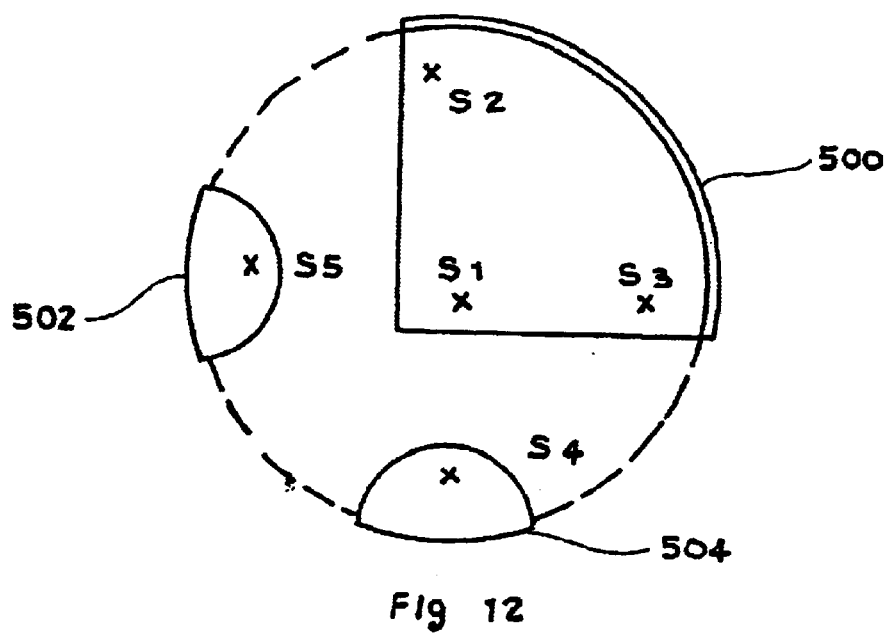

Reference is now made to FIG. 12, which illustrates another possible configuration of a window forming part of the apparatus of Fig. 10A. In this embodiment, two relatively small window fragments are added to the fragment of FIG. 11 These fragments designated as 502 and 504 provide covering of measurements sites $S_4$ and $S_5$ without additional rotation of the wafer W. It is readily appreciated, that the location of additional window fragments is chosen in accordance with desired pre-determined measurement sites.

In order to provide measurement at any desired point on the wafer W, e.g. in sites designated as $S_4$ and $S_5$, only a translation system, such as an X-Y stage for the optical monitoring unit, and data and Image Processing unit as shown on FIG. 1, are needed. It should be noted that another types of translation system, such as, for example (r, φ) could be used.

Figure 13:
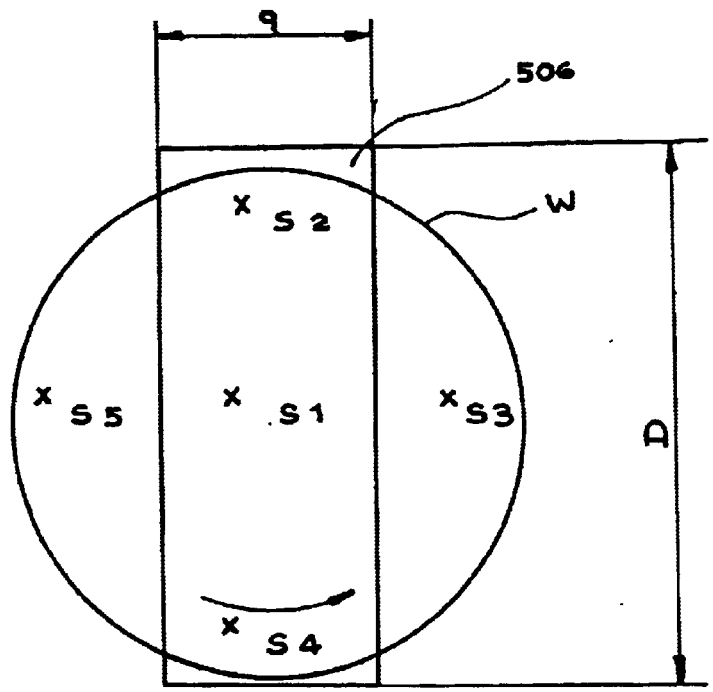

According to another preferred embodiment, as shown in FIG. 13, the window designated 506 has a rectangle shape, covering part of the wafer W surface. Typical locations of the measuring sites are designated $S_1$–$S_5$. In order to provide measuring of the entire wafer's surface, such as in sites designated $S_3$ and $S_5$, the wafer should be rotated by 90°. Such a rotational movement is slow and could be provided by a relatively simple and cheap wafer handling and rotation assembly. When the length D of the window 506 is equal to the diameter of the wafer (as shown in FIG. 13), only one 90° rotation is sufficient to provide measurements of almost the entire wafer. It should be noted, that a window having a width a equal to 200 mm enabling measuring on entire 200 mm wafer and is quite good for measuring a 300 mm wafers with additional rotation thereof.

Figure 14:
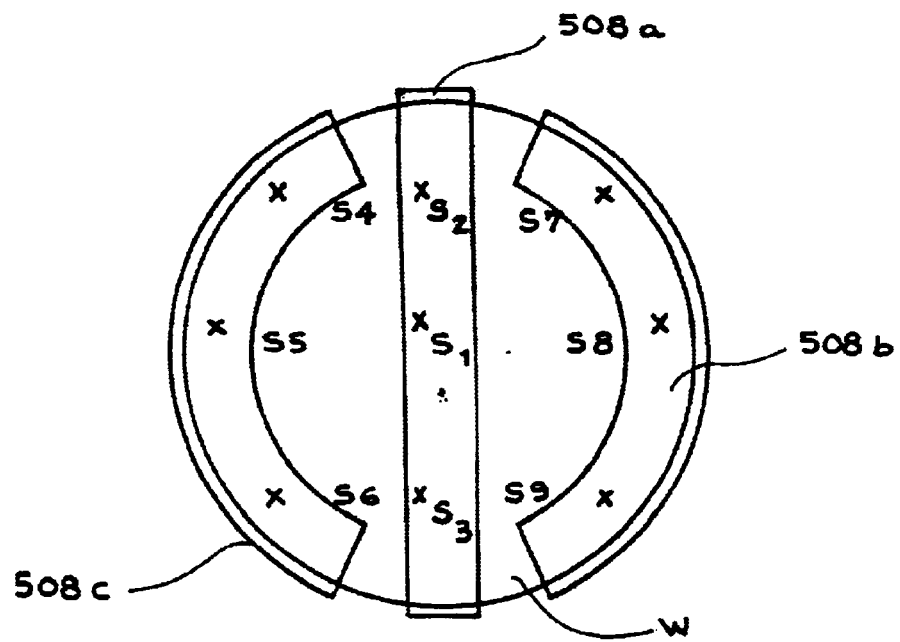

A reference is now made to FIG. 14, which illustrates still another configuration of fragmented optical window in accordance with another preferred embodiment of the invention. Such a configuration enables measuring on multiple sites over the whole wafer's W surface without additional rotation of the wafer. The optical window comprises three separate fragments designated 506*a*–506*c*. The central strip like fragment 506*a* is located above the central portion of the wafer and provides covering of three commonly used measurements sites $S_1$–$S_3$. The width of this fragment is determined according to the field of view and to the numerical aperture of the measuring and positioning (pattern recognition) channel. The length of fragment 506*a* is equal or slightly longer than the wafer's diameter. Two (in this case) additional fragments designated as 506*b* and 506*c* provide covering of measurement sites $S_4$–$S_9$ without additional rotation of the wafer W. These fragments have a bent strip like shape and cover peripheral portions of the wafer. The width of these fragments is also determined according to the field of view and the numerical aperture of the measuring and positioning (pattern recognition) channel.

In order to enable measurements at predetermined selected sites on a workpiece surface, the window configuration should allow for alignment and autofocusing procedures.

In order to provide measuring of desired sites, fine alignment can be performed according to the above-mentioned U.S. Pat. Nos. 5,682,242 and 5,867,590. Wafers usually have an array of generally perpendicular grid lines on its surface and a plurality of directional features. The method disclosed in the above patents, is based on the following steps a) determining the directions of the grid lines relative to the direction of a reference coordinate system, b) detecting a grid junction and a direction of one of the directional features, c) thereby providing a location of the grid junction in the reference coordinate system. Alternatively, an asymmetrical directional feature is detected and its location in the reference coordinate system is determined. Detecting of a direction of the asymmetrical directional feature is based on information on the reference coordinate system orientation with respect to the directions of the grid lines and the distance of the asymmetrical feature from a geometrical center of the surface. The workpiece (e.g. wafer) could be then positioned in accordance with the provided location of the grid junction. The size of the window fragments is designed to be large enough for performing the described procedure for positioning a workpiece and for determining a location on the its surface.

It should be noted that autofocusing technique could be used, e.g. the technique disclosed in U.S. Pat. No. 5,604,344 in the name of Nova Measuring Instruments Ltd. and incorporated herein by reference. Dynamic autofocusing is utilized when it is desired to keep the object permanently in focus while moving relative to the objective lens. These methods are common in automatic optical monitoring systems when it is necessary to inspect or measure a large object surface within a short period of time. The object is continually being scanned and the object typically has a two-dimensional pattern on it. In such cases, stationary autofocusing methods do not function properly since the movement of the object and its pattern affects the sensing of the focus and the received image of the object is blurred. The above-mentioned patent discloses an autofocusing technique, using one or two pattern projected onto the object surface and their imaging onto CCD. In contrast to the object's pattern, the image of the projected pattern is fixed and does not move with respect to the objective lens and the CCD detector. Thus, the image of the pattern strongly contrasts with that of the object and the sharpness of the pattern can be determined. For example, a gray level histogram, plotting number of pixels at each gray level of the received image, can be generated and the image sharpness can be defined as a function of gray level distribution.

Since the disclosed dynamic autofocusing technique performs the autofocusing procedure during the movement, the size of the window fragments should be large enough to enable desired autofocusing.

For example, after completing the measurement procedure in measurement sites covered by window fragment 506*a* (of FIG. 14), the optical head is transferred to the central window's fragment 506*b* and then transferred to the measurement site $S_4$ performing autofocusing procedure while moving within this window fragment.

A typical width of the strip-like fragments is greater than 30 mm.

It should be noted that two or more fragmented windows having different spectral transparency characteristics could be used. In that case, the supporting means should perform appropriate X-Y movement of the wafer like in the previous embodiment in addition to the rotational movement.

It is readily appreciated that the window fragments configuration could be designed in accordance with specific measurement or inspection technique defined by the customer.

It is readily appreciated, that the location of additional fragments of window is chosen in accordance with desired pre-determined measurement sites While specific embodiments of the present invention had been described for the purpose of illustration they do not mean to limit the scope of the invention. It will be understood that skilled persons may carry the invention into practice with many modifications, variations and adaptations, without departing from its spirit or exceeding the scope of the claims.

What is claimed is:

1. An integrated apparatus for optically monitoring a semiconductor workpiece for process control in a semiconductor production process, said apparatus comprising:

a supporting assembly for supporting said workpiece; and an optical monitoring unit positioned opposite a surface of said workpiece and separated therefrom by an optical window, wherein said optical monitoring unit is mounted for reciprocating movement within a plane parallel to said window for monitoring at least one desired parameter of said semiconductor workpiece and has pattern recognition and auto-focusing capabilities;

wherein said optical window comprises a plurality of relatively small window fragments located in pre-determined locations to enable observation of desired pre-determined portions of said workpiece; and wherein the size and shape of said window fragments are selected according to requirements of transparency in a pre-determined spectral range, mechanical strength and ability of pattern recognition and auto-focusing.

2. The integrated apparatus according to claim 1, wherein said desired portions of the workpiece include the center and part of the edge of said workpiece.

3. The integrated apparatus according to claim 2, wherein at least one of said optical window fragments is of a shape of a sector of a circle.

4. The integrated apparatus according to claim 2, wherein at least one of said optical window fragments is of a rectangular shape.

5. The integrated apparatus according to claims 4, wherein said window fragments comprise at least one window fragment having a strip shape bent around the edge of the workpiece.

6. The integrated apparatus according to claim 1, wherein said optical monitoring unit comprises a spectrophotometer.

7. The integrated apparatus according to claim 1, wherein said optical monitoring unit comprises an ellipsometer.

8. The integrated apparatus according to claim 1, wherein said semiconductor workpiece is a wafer.

9. The integrated apparatus according to claim 1, wherein said workpiece has an axis of symmetry, and said supporting assembly is mounted for substantially slow rotation.

10. A method of optically monitoring a semiconductor workpiece having an axis of symmetry for process control in a semiconductor production process, said method comprising:

optically scanning the workpiece using a movable optical unit through an optical window comprising a plurality of relatively small fragments located in pre-determined locations to enable observation of desired portions of the workpiece, the size and shape of said fragments being selected according to requirements of transparency in a pre-determined spectral range, mechanical strength and ability of pattern recognition and autofocusing; and defining at least one desired parameter of said semiconductor workpiece at said desired portions of the workpiece.

11. The method according to claim 10, wherein said desired portions of the workpiece include the center and part of the edge of said workpiece.

12. The method according to claim 10, further comprising rotation of said workpiece by a pre-determined angle.

13. The method according to claim 10, wherein said optical scanning includes pattern recognition and autofocusing.

14. The method according to claim 10, wherein said workpiece has a multi-layer structure and said at least one desired parameter is a thickness of at least one of the layers of said workpiece.

15. The method according to claim 14, wherein said optical scanning includes measuring spectral characteristics of light response of the scanned portions of the workpiece.

16. An apparatus for optically monitoring a semiconductor workpiece in a semiconductor production process, said apparatus comprising:

a chamber defining a measuring area and having on a wall thereof an optical window;

a support disposed inside said chamber for supporting said workpiece; and an optical monitoring unit disposed outside said chamber and facing a surface of said workpiece and separated therefrom by said optical window, said optical monitoring unit being moveable relative to said support for monitoring at least one parameter of said semiconductor workpiece;

wherein said optical window comprises at least one window fragment located at a predetermined location corresponding to a predetermined portion of said workpiece where said at least one parameter is to be monitored;

an entire area of said at least one window fragment is smaller than an entire area of said workpiece;

said window fragment is made of a material transparent to wavelengths in a spectral range used by said optical monitoring unit and has a mechanical strength sufficient to sustain a pressure difference between pressures inside and outside said chamber.

17. The apparatus of claim 16, wherein said chamber is a vacuum chamber in CVD equipment and said workpiece is a wafer.

18. The apparatus of claim 16, comprising multiple said window fragments, wherein a sum of entire areas of all said window fragments is smaller than the entire area of said workpiece.

19. The apparatus of claim 18, wherein said optical monitoring Unit is mounted for reciprocating movement within a plane parallel to said window; and said support is rotatable about an axis.

20. The apparatus of claim 19, wherein said windows fragments are arranged to cover all desired portions of said workpiece where said at least one parameter is to be monitored so that said at least one parameter can be determined at all desired portions of said workpiece in a single scanning action without additional relative rotational movement between said optical monitoring unit and said support.

21. The apparatus of claim 18, wherein at least one of said windows fragments has a shape of a sector of a circle having a radius greater than a radius of said workpiece which is a wafer.

22. The method of claim 10, wherein, in said scanning step, said movable optical unit scans only predetermined portions of a surface of said workpiece, which is a semiconductor water, without scanning an entirety of said surface of said semiconductor wafer.

* * * * *